United States Patent

Dijkmans et al.

[11] Patent Number: 5,955,923
[45] Date of Patent: Sep. 21, 1999

[54] AMPLIFIER WITH REDUCED CROSS-OVER DISTORTION

[75] Inventors: Eise C. Dijkmans; Anthonius F. Duisters, both of Eindhoven, Netherlands

[73] Assignee: U.S. Philips Corporation, New York, N.Y.

[21] Appl. No.: 08/538,510

[22] Filed: Oct. 3, 1995

[30] Foreign Application Priority Data

Oct. 10, 1994 [EP] European Pat. Off. ............ 94 202 924

[51] Int. Cl.⁶ .................................................. H03F 3/26
[52] U.S. Cl. ............................................ 330/264; 330/268
[58] Field of Search .................................. 330/263, 264, 330/267, 268

[56] References Cited

U.S. PATENT DOCUMENTS

| | | | |
|---|---|---|---|
| 4,570,128 | 2/1986 | Monticelli | 330/267 |
| 4,857,863 | 8/1989 | Ganger et al. | 330/264 |
| 5,057,790 | 10/1991 | Landi | 330/268 |

*Primary Examiner*—Steven J. Mottola
*Attorney, Agent, or Firm*—Edward W. Goodman

[57] ABSTRACT

An amplifier arrangement having a first and a second output transistor, which are drain-connected to the output terminal. A driver stage (100), prevents the output transistors from becoming non-conductive, thereby reducing cross-over distortion. This is achieved by applying an input signal via the sources of a source coupled transistor pair to the gates of the output transistors. Additional source followers are provided for defining gate-sources voltages which prevent the output transistors from becoming non-conductive.

20 Claims, 3 Drawing Sheets

AMPLIFIER WITH REDUCED CROSS-OVER DISTORTION

BACKGROUND OF THE INVENTION

This invention relates to an amplifier arrangement, comprising:

an input terminal, an output terminal, and first and a second supply terminal for receiving a supply voltage, a first transistor of a first conductivity type and a second transistor of a second conductivity type, each having a control electrode and a first and a second main electrode, a driver stage having an input coupled to the input terminal and having first and second outputs coupled to the control electrodes of the first and the second transistors, respectively, the second main electrodes of the first and the second transistors being coupled to the first and the second supply terminal, respectively, and the first main electrodes of the first and second transistors being coupled to the output terminal.

Such an amplifier arrangement is known from FIG. 1 of U.S. Pat. No. 4,570,128. The driver stage in the known amplifier arrangement comprises third and fourth transistors coupled anti-parallel between the first and second outputs of the driver stage. The control electrodes of the third and fourth transistors are coupled to respective biasing means. The input of the driver stage is coupled to the second output of the driver stage so that a signal current applied to the input is directly applied to the control electrode of the second transistor. A signal current applied to the input terminal will result in a simultaneous increase or decrease of the potentials on the control electrodes of the first and second output transistors. Due to the simultaneous variation of these potentials, it is possible to drive the control electrode potential of one of the first and second transistors close to the supply terminal voltage, thus effectively turning the transistor off when a large signal current is applied to the input terminal. A drawback of this arrangement is that it takes a finite amount of time to turn the transistor back on when the signal current decreases again. This turn-on time causes distortion, especially during cross-over when the first transistor takes over from the second transistor or vice versa.

SUMMARY OF THE INVENTION

An object of the invention is to provide an amplifier arrangement having a reduced distortion.

An amplifier arrangement according to the invention is characterised in that said driver stage comprises:

third and sixth transistors of the second conductivity type, and fourth and fifth transistors of the first conductivity type, each transistor having a control electrode, a first and a second main electrode, a first current source for supplying a first current, coupled between the first supply terminal and the first output of the driver stage, a second current source for supplying a second current, coupled between the second output of the driver stage and the second supply terminal, biasing means for supplying respective bias voltages to the control electrodes of the third, fourth, fifth and sixth transistors, the second main electrodes of the third and the fourth transistor being coupled to the input of the driver stage, the first main electrode of the third transistor and the second main electrode of the fifth transistor being coupled to the first output of the driver stage, the first main electrode of the fourth transistor and the second main electrode of the sixth transistor being coupled to the second output of the driver stage.

The invention is based on the recognition that distortion can be reduced by preventing the output transistors from being turned off due to large input signals. The first current supplied by the first current source will be divided equally over the transistor couple formed by the third and the fifth transistors, just as the second current supplied by the second current source will be divided equally over the transistor couple formed by the fourth and sixth transistors. A signal applied to the input of the driver stage will result in a different current division for each of the transistor couples. In the extreme situation one of the transistors in the couples can become current-less. If the third or fourth transistor becomes current-less the presence of the fifth or sixth transistor, respectively, will ensure that the first or second transistor remains biased, thus always conducting a minimum current. By this measure according to the invention the output transistors cannot become non-conductive and consequently distortion is reduced.

An embodiment of the amplifier arrangement according to the invention is characterised in that the first main electrodes of the fifth and the sixth transistor are coupled to the input of the driver stage.

By connecting the first main electrodes of the fifth and sixth transistors to the input a very high impedance is seen at the input of the driver stage, resulting in a high gain of the amplifier arrangement.

An embodiment of the amplifier arrangement according to the invention comprising a Miller compensation is characterised in that the amplifier arrangement comprises a capacitance coupled between the output terminal and the input of the driver stage.

The symmetrical structure of the amplifier arrangement allows a feedback with a single capacitance from the output terminal to the input of the driver stage for providing a Miller compensation.

Other advantageous embodiments are described below and are claimed in the dependent claims.

BRIEF DESCRIPTION OF THE DRAWING

The above object and features of the present invention will be more apparent from the following description of the preferred embodiments with reference to the drawings acompanying, wherein.

DESCRIPTION OF THE PREFERRED EMBODIMENTS

In the figures, identical parts are provided with the same reference numbers. The invention is illustrated using MOS transistors, in which the control electrode is the gate, the first main electrode the drain and the second main electrode the source. It is also possible to use bipolar transistors, in which the control electrode is the base, the first main electrode the collector and the second main electrode the emitter. A transistor of the first conductivity type is a p-channel MOS transistor and a transistor of the second conductivity type is then an n-channel MOS transistor, or vice versa.

Figure 1:
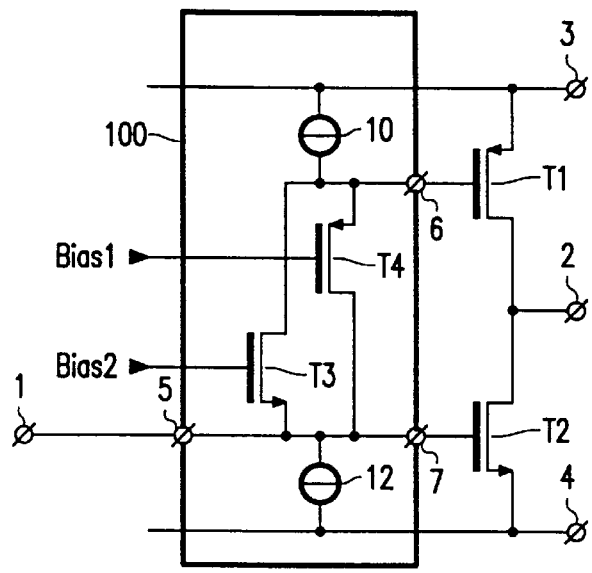
FIG. 1 is a circuit diagram of a known amplifier arrangement using MOS transistors.

FIG. 1 is a circuit diagram of a known amplifier arrangement using MOS transistors. The known amplifier arrangement comprises:

- an input terminal 1, an output terminal 2, a first and a second supply terminal 3, 4 for receiving a supply voltage,
- a first p-channel transistor and a second n-channel transistor T1, T2,
- a driver stage 100 having an input 5 coupled to the input terminal 1 and having first and second outputs 6, 7 coupled to the gates of the first and the second transistors T1, T2, respectively.

The sources of the first and the second transistors T1, T2 are coupled to the first and the second supply terminal 3, 4, respectively, and the drains of the first and second transistors T1, T2 are coupled to the output terminal 2. The driver stage 100 comprises a third n-channel transistor T3 and a fourth p-channel transistor T4. The third and fourth transistors T3, T4 are coupled anti-parallel between the first and second outputs 6 and 7. The gates are biased with respective bias voltages. A first current source 10 supplying a first current is coupled between the first supply terminal 3 and the first output 6 and a second current source 12 supplying a second current is coupled between the second output 7 and the second supply terminal 4. The input 5 of the driver stage 100 is coupled to the second output 7, which is coupled to the source of the third transistor T3. A signal current is applied to the input 5 of the driver stage 100. As the signal current increases, the potential at the gate of transistor T2 will rise and the current through transistor T3 will decrease because the second current supplied by the second current source 12 is constant. This will raise the potential at the gate of transistor T1 and thereby decrease the current through transistor T1 so that the output terminal 2 will sink current. Since the drain of transistor T3 looks into the source of transistor T4 the grounded gate configuration of transistors T3 and T4 will produce unity gain from the gate of transistor T1 to the gate of transistor T2. In the converse, as the signal current is reduced, the current through transistor T3 will have to increase. This will lower the potential at the gate of transistor T2 thereby increasing the current through transistor T1 so that the output terminal 2 will source current. Thus a signal current applied to the input 5 will result in a simultaneous increase or decrease in the gate potential of both first and second transistors T1 and T2. At very large signal currents this can cause the gate-source potential of the first or the second transistor to become close to zero, thus rendering the transistor non-conductive. Due to internal parasitic capacitances it takes a finite amount of time to turn the transistor back on after being turned off (i.e. non-conductive). This delay causes distortion, especially during cross-over when transistor T1 will take over from transistor T2 or vice versa.

Figure 2:
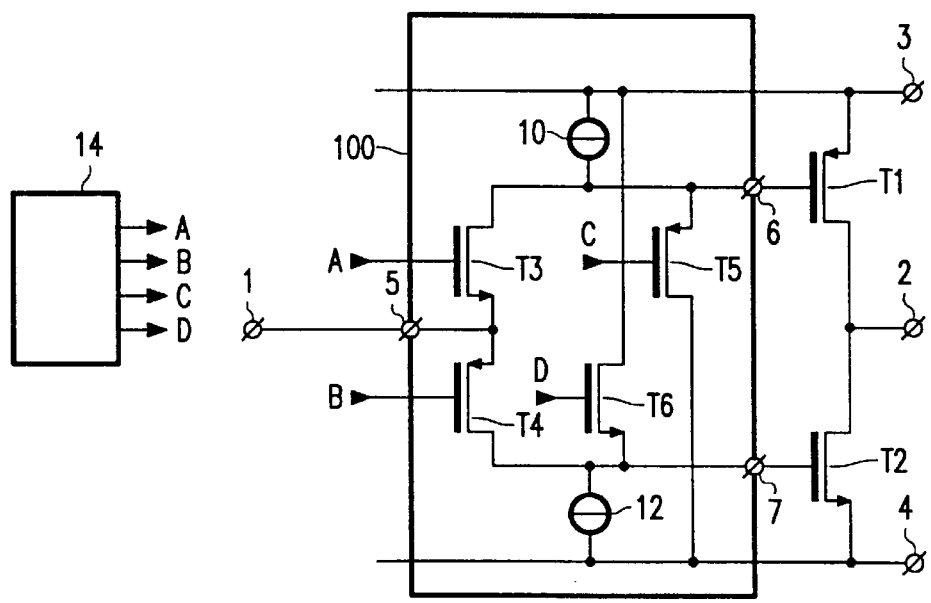
FIG. 2 is a circuit diagram of a first embodiment of an amplifier arrangement according to the invention using MOS transistors.

FIG. 2 is a circuit diagram of a first embodiment of an amplifier arrangement according to the invention using MOS transistors. The driver stage 100 of FIG. 2 differs from the driver stage 100 of FIG. 1 in the following:

- the driver stage 100 further comprises a fifth p-channel transistor T5 and a sixth n-channel transistor T6, and
- biasing means 14 for supplying respective bias voltages to the gates of transistors T3, T4, T5, T6,
- the sources of the third and the fourth transistor T3, T4 are coupled to the input 5 of the driver stage 100, the drain of the third transistor T3 and the source of the fifth transistor T5 are coupled to the first output 6 of the driver stage 100, and the drain of the fourth transistor T4 and the source of the sixth transistor T6 are coupled to the second output 7 of the driver stage 100.

The fifth and sixth transistors T5 and T6 operate as source followers. The third and fifth transistors T3, T5 form a pair, the sum of the currents through the transistors being equal to the first current supplied by the first current source 10. The fourth and sixth transistors T4, T6 also form a pair, the sum of the currents through the transistors being equal to the second current supplied by the second current source 12. When no signal current is applied to the input 5 the quiescent currents of the third, fourth, fifth and sixth transistors can be chosen to be equal to half of the first current in the case that the first current equals the second current. When a signal current is applied to the input 5 having a negative value for instance, thus sinking current from the input 5, this extra current will be supplied by transistor T3, which will conduct more current. As the sum of the currents through transistors T3 and T5 is constant, transistor T5 will conduct less current. Thus the source voltage of transistor T5 will drop and consequently transistor T1 will conduct more current. As transistor T3 conducts more current, its source voltage will drop as well, resulting in a current decrease through transistor T4. This results in a current increase through transistor T6 and thus the source voltage of transistor T6 will drop as well. A current increase through transistor T3 will not result in an equal current decrease through transistor T4 due to the current sink at the input 5. Thus the current distribution in the second pair, comprising transistors T4 and T6, will be changed less than the current distribution in the first pair, comprising transistors T3 and T5. This means that the change in source voltage of transistor T5 is larger than the change in source voltage of transistor T6. In the situation that the current distribution is so extreme that one of the transistors in a pair becomes non-conductive, for example transistor T4 in the case of a very large negative signal current applied at the input 5, transistor T6 will conduct all the current sinked by the second current source 12. As this second current has a fixed value the source potential of transistor T6 is fixed and thereby the gate potential of transistor T2 is fixed as well. By a suitable choice of gate bias voltage of transistor T6 and the value of the second current the current through transistor T2 can be set at a minimum value, thus preventing transistor T2 to become non-conductive. A similar discussion can be held for a positive signal current applied to the input 5. A further advantage, next to preventing transistors T1 and T2 from becoming non-conductive, is that the input 5 can be biased at a value in between the supply voltage. This is not possible in the known amplifier arrangement, where the input 5 is biased at a value close to the value of one of the supply terminals. This further advantage allows more freedom of design for the stage preceding the amplifier arrangement.

Figure 3:
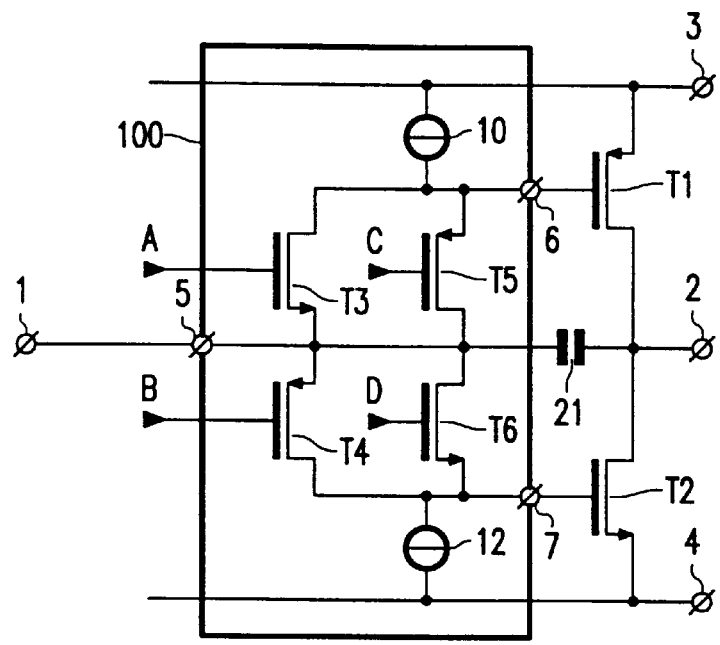
FIG. 3 is a circuit diagram of a second embodiment of an amplifier arrangement according to the invention using MOS transistors.

In FIG. 2 the drains of the transistors T5 and T6 are coupled to the second and first supply terminals 4 and 3, respectively. Thus a signal current flowing through transistor T3 will see a low impedance at the gate of the first transistor T1, said low impedance being the impedance seen at the source of the fifth transistor T5. This results in a low amplification factor for the amplifier arrangement as the signal current will cause only a small signal voltage over this low impedance. FIG. 3 is a circuit diagram of a second embodiment of an amplifier arrangement according to the invention using MOS transistors. In FIG. 3 however, the drains of the transistors T5 and T6 are both coupled to the input 5 of the driver stage 100. Through this feedback a very high impedance is realised at input 5. Now a small current change will result in a large voltage change at the gate of the first or the second transistor T1, T2 as at this gate the impedance is now mainly determined by the finite output impedance of the first or the second current source 10, 12, said output impedance being usually very high. Thus the gain of the amplifier arrangement is significantly improved.

In FIG. 3 a capacitance 21 is coupled between the output terminal 2 and the input 5. This capacitance provides a Miller compensation, which compensation is well known to a person skilled in the art. From the Journal of Solid-State Circuits, Vol. 29, No. 1, January 1994, page 64, a Miller compensation is known using two capacitances coupled from drain to gate of each of the first and second transistors T1, T2. This has as a main drawback that a sudden voltage change at the gate of one of the transistors T1 or T2 will have an effect on the gate of the other transistor due to the capacitive coupling. This effect will also take place when one of the transistors is conducting the minimum current and does not carry any signal current. This is avoided by using a single feedback capacitance from the output terminal 2 to the input 5. Now there is no longer a capacitive coupling between the gates of the first and second transistors.

Figure 4:
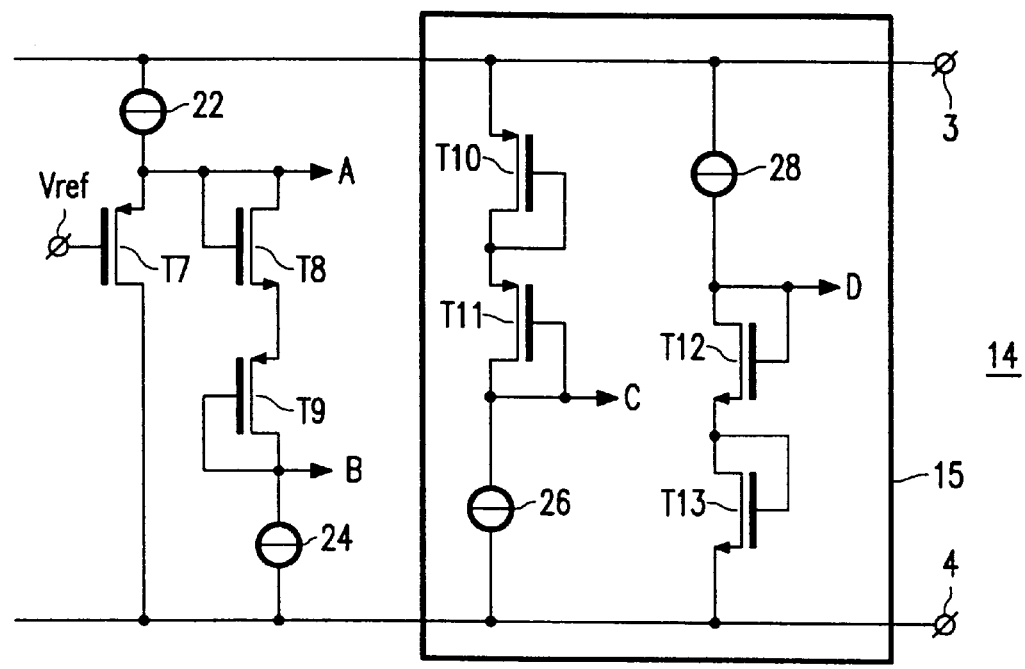
FIG. 4 is a circuit diagram of an example of the biasing means for use in conjunction with the shown embodiments of the amplifier arrangement according to the invention.

FIG. 4 is a circuit diagram of an example of the biasing means for use in conjunction with the shown embodiments of the amplifier arrangement according to the invention.

The biasing means 14 comprises:

seventh p-channel, eighth n-channel and ninth p-channel transistors T7, T8, T9, a third current source 22 for supplying a third current, coupled between the first supply terminal 3 and the source of the seventh transistor T7, a fourth current source 24 for supplying a fourth current, coupled between the drain of the ninth transistor T9 and the second supply terminal 4.

The gate and the drain of the eighth transistor T8 are coupled to the source of the seventh transistor T7 and the sources of the eighth and ninth transistors T8, T9 are interconnected. The drain of the ninth transistor T9 is coupled to the gate of said transistor T9. The gate of the seventh transistor T7 is coupled to a reference voltage Vref and the gates of the eighth and the ninth transistors T8, T9 are coupled to the gates of the third and the fourth transistor T3, T4, respectively.

The reference voltage Vref coupled to the gate of transistor T7 is preferably chosen at a value corresponding to half the supply voltage. Transistors T8 and T9 are used a diodes and biased via current source 24. The transistors T8 and T9 can be seen as copies of transistors T3 and T4. For a proper matching the current densities through these transistors should be equal, meaning that the ratio of the current through a transistor and the surface area of that transistor should be equal for transistor T3 and T8 as well as for transistors T4 and T9. If the surface areas of these transistors are equal, then the current supplied by current source 24 should be half the current supplied by current source 12 (or 10) as transistors T3 and T4 carry only half the current supplied by current source 10 or 12, respectively. The biasing means 14 further comprises:

a fifth current source 26 for supplying a fifth current and a tenth and an eleventh p-channel transistor T10, T11, the fifth current source 26 being coupled between the second supply terminal 4 and the drain of the eleventh transistor T11, the gate and the drain of the eleventh transistor T11 being interconnected, the source of the eleventh transistor T11 being coupled to the gate and the drain of the tenth transistor T10, the source of the tenth transistor T10 being coupled to the first supply terminal 3, a sixth current source 28 for supplying a sixth current and a twelfth and a thirteenth n-channel transistor T12, T13, the sixth current source 28 being coupled between the first supply terminal 3 and the drain of the twelfth transistor T12, the gate and the drain of the twelfth transistor T12 being interconnected, the source of the twelfth transistor T12 being coupled to the gate and the drain of the thirteenth transistor T13, the source of the thirteenth transistor T13 being coupled to the second supply terminal 4.

Transistors T10, T11, T12, T13 are connected as diodes and are biased with currents supplied by current source 26 for transistors T10 and T11 and supplied by current source 28 for transistors T12 and T13. As transistors T11 and T12 can be seen as copies of transistors T5 and T6, respectively, and transistors T10 and T13 can be regarded as scaled copies of transistors T1 and T2, respectively, the current densities of associated transistors (for instance: T11 and T5, or: T10 and T1) should preferably be equal for a good matching. If the surface areas of associated transistors are equal, the currents of current sources 26 and 28 should be half the current supplied by current sources 10 and 12.

Figure 5:
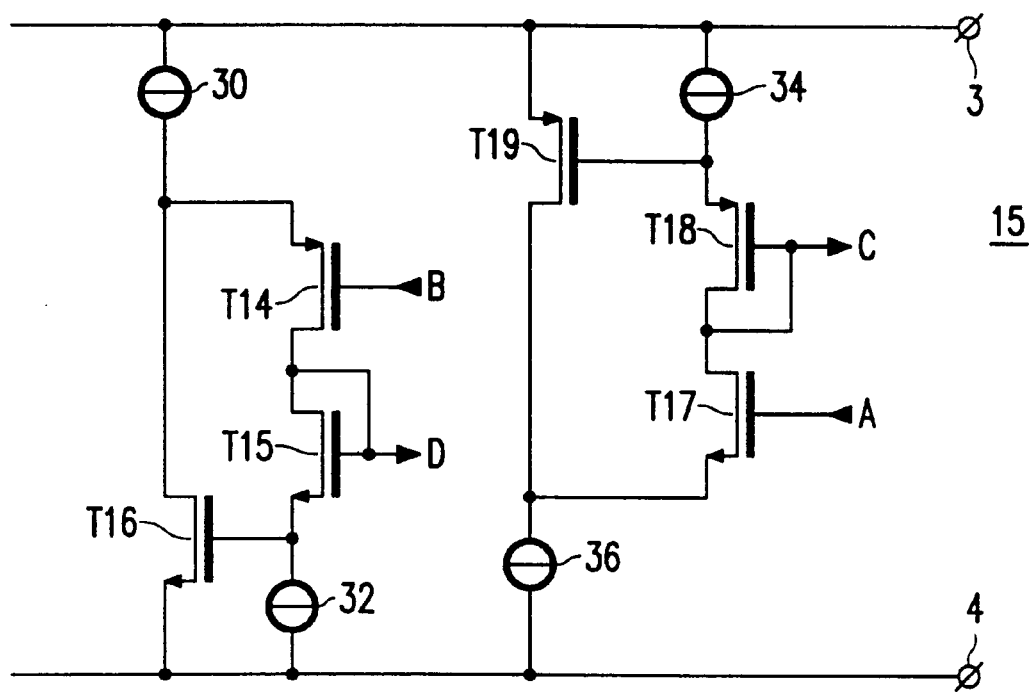
FIG. 5 is a circuit diagram of a further example of part 15 of the biasing means for use in conjunction with the shown embodiments of the amplifier arrangement according to the invention.

FIG. 5 is a circuit diagram of a further example of part 15 of the biasing means for use in conjunction with the shown embodiments of the amplifier arrangement according to the invention. This part 15 is biasing the gates of transistors T5 and T6. From FIG. 4 transistors T10, T11, T12 and T13 together with current sources 26 and 28 are replaced by the following:

transistors T14, T15, T16, T17, T18, T19, the transistors T14, T18, T19 being p-channel transistors and the transistors T15, T16, T17 being n-channel transistors, a current source 30 for supplying a fifth current, coupled between the first supply terminal 3 and the source of the transistor T14, a current source 32 for supplying a sixth current, coupled between the source of the transistor T15 and the second supply terminal 4, a current source 34 for supplying a seventh current, coupled between the first supply terminal 3 and the source of the transistor T18, a current source 36 for supplying an eighth current, coupled between the second supply terminal 4 and the source of the transistor T17.

The gate of transistor T14 is coupled to the gate of the fourth transistor T4 and the drain of transistor T14 is coupled to the gate and the drain of transistor T15 and the gate of the sixth transistor T6. The drain of transistor T16 is coupled to the source of transistor T14. The source of transistor T16 is coupled to the second supply terminal 4. The gate of transistor T16 is coupled to the source of transistor T15. The gate of transistor T17 is coupled to the gate of the third transistor T3, and the drain of transistor T17 is coupled to the gate and the drain of transistor T18 and the gate of the fifth transistor T5. The drain of transistor T19 is coupled to the source of transistor T17. The source of transistor T19 is coupled to the first supply terminal 3, and the gate of transistor T19 is coupled to the source of transistor T18. Transistors T16 and T19 are scaled copies of transistors T2 and T1, respectively. Transistors T15 and T18 are copies of transistors T6 and T5. Transistors T14 and T17 are used as level shifters, defining the drain voltages of transistors T16 and T19, respectively, and—indirectly —the drain voltage of transistors Ti and T2 as well. For a good matching the current densities of associated transistors should again be substantially equal. By a suitable choice of the current supplied by current source 30 and the current supplied by current source 32 and proper scaling factors of transistors T16 and T15 with respect to transistors T2 and T6, respectively, a copy of the current through transistor T16 will flow through transistor T2.

The invention is not limited to the embodiments using MOS transistors. It is also possible to use bipolar transistors, in which case gate, drain and source should be replaced by base, collector and emitter. A transistor of the first conductivity type will then be a PNP transistor and a transistor of the second conductivity type will be an NPN transistor. The source followers T5 and T6 should then be renamed emitter followers.

We claim:

1. An amplifier arrangement, comprising:

an input terminal, an output terminal, and a first and a second supply terminal for receiving a supply voltage, a first transistor of a first conductivity type and a second transistor of a second conductivity type, each having a control electrode and a first and second main electrode, a driver stage having an input coupled to the input terminal and having first and second outputs coupled to the control electrodes of the first and the second transistors, respectively, the second main electrodes of the first and the second transistors being coupled to the first and the second supply terminal, respectively, and the first main electrodes of the first and second transistors being coupled to the output terminal, wherein said driver stage comprises:

third and sixth transistors of the second conductivity type, and fourth and fifth transistors of the first conductivity type, each transistor having a control electrode and a first and a second main electrode, a first current source for supplying a first current and coupled between the first supply terminal and the first output of the driver stage, a second current source for supplying a second current and coupled between the second output of the driver stage and the second supply terminal, biasing means for supplying respective bias voltages to the control electrodes of the third, fourth, fifth and sixth transistors, the second main electrodes of the third and fourth transistor being coupled to the input of the driver stage, the first main electrode of the third transistor and the second main electrode of the fifth transistor being coupled to the first output of the driver stage, and the first main electrode of the fourth transistor and the second main electrode of the sixth transistor being coupled to the second output of the driver stage.

2. The amplifier arrangement of claim 1, wherein the first main electrodes of the fifth and the sixth transistor (5) are coupled to the input (5) of the driver stage.

3. The amplifier arrangement of claim 2, which further comprises a capacitance (2) coupled between the output terminal (2) and the input of the driver stage.

4. The amplifier arrangement of claim 1, 2 or 3, wherein the biasing means comprises:

seventh, eighth and ninth transistors, each having a control electrode and a first and a second main electrode, the eighth transistor (T8) being of the second conductivity type and the seventh and ninth transistors being of the first conductivity type, a third current source, for supplying a third current being coupled between the first supply terminal and the second main electrode of the seventh transistor, a fourth current source, for supplying a fourth current, coupled between the first main electrode of the ninth transistor and the second supply terminal, the control electrode and the first main electrode of the eighth transistor being coupled to the second main electrode of the seventh transistor, the second main electrodes of the eighth and ninth transistors being interconnected, the first main electrode of the ninth transistor being coupled to the control electrode of said transistor, the control electrode of the seventh transistor being coupled to a reference voltage, and the control electrodes of the eighth and the ninth transistors being coupled to the control electrodes of the third and the fourth transistor, respectively.

5. The amplifier arrangement of claim 4, wherein the value of the fourth current is substantially equal to half of the value of the first current, and the value of the first current is substantially equal to the value of the second current.

6. The amplifier arrangement of claim 4 wherein the biasing means further comprises:

a fifth current source for supplying a fifth current and a tenth and an eleventh transistor, each transistor being of the first conductivity type and having a control electrode and a first and a second main electrode, the fifth current source being coupled between the second supply terminal and the first main electrode of the eleventh transistor, the control electrode and the first main electrode of the eleventh transistor being interconnected, the second main electrode of the eleventh transistor being coupled to the control electrode and the first main electrode of the tenth transistor, the second main electrode of the tenth transistor being coupled to the first supply terminal, a sixth current source for supplying a sixth current and a twelfth and a thirteenth transistor each of the second conductivity type and having a control electrode and a first and a second main electrode, the sixth current source being coupled between the first supply terminal and the first main electrode of the twelfth transistor, the control electrode and the first main electrode of the twelfth transistor being interconnected, the second main electrode of the twelfth transistor being coupled to the control electrode and the first main electrode of the thirteenth transistor (T13), and the second main electrode of the thirteenth transistor being coupled to the second supply terminal.

7. The amplifier arrangement of claim 6, wherein the values of the fifth and the sixth currents are each substantially equal to half of the value of the first current.

8. The amplifier arrangement of claim 4 wherein the biasing means further comprises:

tenth, eleventh, twelfth, thirteenth, fourteenth and fifteenth transistors, each having a control electrode, a first and a second main electrode, the tenth, fourteenth and fifteenth transistors being of the first conductivity type and the eleventh, twelfth and thirteenth transistors being of the second conductivity type, a fifth current source for supplying a fifth current and coupled between the first supply terminal and the second main electrode of the tenth transistor, the control electrode of the tenth transistor being coupled to the control electrode of the fourth transistor and the first main electrode of the tenth transistor being coupled to the control electrode and the first main electrode of the eleventh transistor and the control electrode of the sixth transistor, a sixth current source for supplying a sixth current and coupled between the second main electrode of the eleventh transistor and the second supply terminal, the first main electrode of the twelfth transistor being coupled to the second main electrode of the tenth transistor, the second main electrode of the twelfth transistor being coupled to the second supply terminal, the control electrode of the twelfth transistor being coupled to the second main electrode of the eleventh transistor, a seventh current source for supplying a seventh current and coupled between the first supply terminal and the second main electrode of the fourteenth transistor, an eighth current source for supplying an eighth current and coupled between the second supply terminal and the second main electrode of the thirteenth transistor, the control electrode of the thirteenth transistor being coupled to the control electrode of the third transistor and the first main electrode of the thirteenth transistor being coupled to the control electrode and the first main electrode of the fourteenth transistor and the control electrode of the fifth transistor, the first main electrode of the fifteenth transistor being coupled to the second main electrode of the thirteenth transistor, the second main electrode of the fifteenth transistor being coupled to the first supply terminal, and the control electrode of the fifteenth transistor being coupled to the second main electrode of the fourteenth transistor.

9. The amplifier arrangement of claim 8, wherein the values of the sixth and the eighth currents are each substantially equal to half the value of the first current.

10. The amplifier arrangement of claim 2, wherein the biasing means comprises:

seventh, eighth and ninth transistors each having a control electrode and a first and a second main electrode, the eighth transistor being of the second conductivity type and the seventh and ninth transistors being of the first conductivity type, a third current source, for supplying a third current, being coupled between the first supply terminal and the second main electrode of the seventh transistor, a fourth current source, for supplying a fourth current, coupled between the first main electrode of the ninth transistor and the second supply terminal, the control electrode and the first main electrode of the eighth transistor being coupled to the second main electrode of the seventh transistor, the second main electrodes of the eighth and ninth transistors being interconnected, the first main electrode of the ninth transistor being coupled to the control electrode of said transistor, the control electrode of the seventh transistor being coupled to a reference voltage, and the control electrodes of the eighth and the ninth transistors being coupled to the control electrodes of the third and the fourth transistor, respectively.

11. The amplifier arrangement of claim 3, wherein the biasing means comprises:

seventh, eighth and ninth transistors each having a control electrode and a first and a second main electrode, the eighth transistor being of the second conductivity type and the seventh and ninth transistors being of the first conductivity type, a third current source, for supplying a third current, being coupled between the first supply terminal and the second main electrode of the seventh transistor, a fourth current source, for supplying a fourth current, coupled between the first main electrode of the ninth transistor and the second supply terminal, the control electrode and the first main electrode of the eighth transistor being coupled to the second main electrode of the seventh transistor, the second main electrodes of the eighth and ninth transistors being interconnected, the first main electrode of the ninth transistor being coupled to the control electrode of said transistor, the control electrode of the seventh transistor being coupled to a reference voltage, and the control electrodes of the eighth and the ninth transistors being coupled to the control electrodes of the third and the fourth transistor, respectively.

12. The amplifier arrangement of claim 11, wherein the value of the fourth current is substantially equal to half of the value of the first current, and the value of the first current is substantially equal to the value of the second current.

13. The amplifier arrangement of claim 5, wherein the biasing means further comprises:

a fifth current source for supplying a fifth current and a tenth and an eleventh transistor, each transistor being of the first conductivity type and having a control electrode and a first and a second main electrode, the fifth current source being coupled between the second supply terminal and the first main electrode of the eleventh transistor, the control electrode and the first main electrode of the eleventh transistor being interconnected, the second main electrode of the eleventh transistor being coupled to the control electrode and the first main electrode of the tenth transistor, the second main electrode of the tenth transistor being coupled to the first supply terminal, a sixth current source for supplying a sixth current and a twelfth and a thirteenth transistor each of the second conductivity type and having a control electrode and a first and a second main electrode, the sixth current source being coupled between the first supply terminal and the first main electrode of the twelfth transistor, the control electrode and the first main electrode of the twelfth transistor being interconnected, the second main electrode of the twelfth transistor being coupled to the control electrode and the first main electrode of the thirteenth transistor, and the second main electrode of the thirteenth transistor being coupled to the second supply terminal.

14. The amplifier arrangement of claim 5, wherein the biasing means further comprises:

tenth, eleventh, twelfth, thirteenth, fourteenth and fifteenth transistors, each having a control electrode, a first and a second main electrode, the tenth, fourteenth and fifteenth transistors being of the first conductivity type and the eleventh, twelfth and thirteenth transistors being of the second conductivity type, a fifth current source for supplying a fifth current and coupled between the first supply terminal and the second main electrode of the tenth transistor, the control electrode of the tenth transistor being coupled to the control electrode of the fourth transistor and the first main electrode of the tenth transistor being coupled to the control electrode and the first main electrode of the eleventh transistor and the control electrode of the sixth transistor, a sixth current source for supplying a sixth current and coupled between the second main electrode of the eleventh transistor and the second supply terminal, the first main electrode of the twelfth transistor being coupled to the second main electrode of the tenth transistor, the second main electrode of the twelfth transistor being coupled to the second supply terminal, the control electrode of the twelfth transistor being coupled to the second main electrode of the eleventh transistor, a seventh current source for supplying a seventh current and coupled between the first supply terminal and the second main electrode of the fourteenth transistor, an eighth current source for supplying an eighth current and coupled between the second supply terminal and the second main electrode of the thirteenth transistor, the control electrode of the thirteenth transistor being coupled to the control electrode of the third transistor and the first main electrode of the thirteenth transistor being coupled to the control electrode and the first main electrode of the fourteenth transistor and the control electrode of the fifth transistor, the first main electrode of the fifteenth transistor being coupled to the second main electrode of the thirteenth transistor, the second main electrode of the fifteenth transistor being coupled to the first supply terminal, and the control electrode of the fifteenth transistor being coupled to the second main electrode of the fourteenth transistor.

15. The amplifier arrangement of claim 14, wherein the values of the sixth and the eighth currents are each substantially equal to half the value of the first current.

16. The amplifier arrangement as claimed in claim 1 wherein the first main electrodes of the fifth and sixth transistors are connected to the second and first supply terminals, respectively.

17. An amplifier cuircuit comprising:

an input terminal, an output terminal, first and second supply terminals for connection to a DC supply voltage, a first transistor of a first conductivity type and a second transistor of a second conductivity type, each having a control electrode and a first and second main electrode, a driver stage having an input coupled to the input terminal and having first and second outputs coupled to the control electrodes of the first and second transistors, respectively, the second main electrodes of the first and second transistors being coupled to the first and second supply terminal, respectively, and the first main electrodes of the first and second transistors being coupled to the output terminal, wherein said driver stage comprises;

a third transistor of the second conductivity type and a fourth transistor of the first conductivity type connected in series, in the order named, between the first and second outputs of the driver stage, and with a junction point therebetween coupled to the input of the driver stage, fifth and sixth transistors of opposite conductivity type each having a first main electrode coupled to a respective output of the driver stage, means for biasing control electrodes of the third, fourth, fifth and sixth transistors, a first current source coupled between the first supply terminal and the first output of the driver stage, and a second current source coupled between the second output of the driver stage and the second supply terminal.

18. The amplifier circuit as claimed in claim 17 wherein the fifth and sixth transistors each have a second main electrode coupled to the second and first supply terminals, respectively.

19. The amplifier circuit as claimed in claim 17 wherein the fifth and sixth transistors are connected in series between the first and second outputs of the driver stage and in parallel with the series connection of the third and fourth transistors and with a junction point therebetween coupled to the input of the driver stage.

20. The amplifier circuit as claimed in claim 19 further comprising a capacitor coupled to the input of the driver stage and to the output terminal.

* * * * *